United States Patent
Yoo (10) Patent No.: US 7,068,078 B2
(45) Date of Patent: Jun. 27, 2006

(54) DATA OUTPUT DRIVER

(75) Inventor: Seong-Jong Yoo, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/877,556

(22) Filed: Jun. 24, 2004

(65) Prior Publication Data

US 2005/0057281 A1    Mar. 17, 2005

(30) Foreign Application Priority Data

Aug. 25, 2003    (KR)    ...... 10-2003-0058722

(51) Int. Cl.
*H03K 19/094*    (2006.01)
(52) U.S. Cl. .............. 326/87; 326/27; 326/30
(58) Field of Classification Search ............ 326/26–27, 326/30, 87, 90, 91; 327/108–109, 111–112
See application file for complete search history.

(56) References Cited

U.S. PATENT DOCUMENTS

| | | |
|---|---|---|
| 5,629,634 A | 5/1997 | Carl et al. |
| 5,729,157 A | 3/1998 | Monk et al. |
| 5,995,440 A | 11/1999 | Lewis et al. |
| 6,118,310 A | 9/2000 | Esch, Jr. |
| 6,184,749 B1 | 2/2001 | Hsiao |
| 6,326,821 B1 * | 12/2001 | Gabara ............... 327/112 |
| 6,337,834 B1 | 1/2002 | Isobe et al. |
| 6,373,286 B1 | 4/2002 | Loeffler et al. |
| 6,462,591 B1 | 10/2002 | Garrett, Jr. et al. |
| 6,469,539 B1 | 10/2002 | Kim |
| 6,556,052 B1 | 4/2003 | Garrett, Jr. et al. |
| 6,888,370 B1 * | 5/2005 | Luo et al. ............ 326/30 |
| 6,909,305 B1 * | 6/2005 | Li et al. ............... 326/30 |
| 2001/0007115 A1 | 7/2001 | Yim et al. |

FOREIGN PATENT DOCUMENTS

| | | |
|---|---|---|
| JP | 09-064720 | 3/1997 |
| JP | 2001-144821 | 5/2001 |

* cited by examiner

*Primary Examiner*—Anh Q. Tran
(74) *Attorney, Agent, or Firm*—Blakely Sokoloff Taylor & Zafman (57) ABSTRACT

A data output driver, for use in a semiconductor memory device, includes a pull-up driving unit, having N numbers of unit pull-up drivers and N numbers of pull-up resistors, turned on by selected pull-up control signals for pull-up driving the output terminal in response to a pull-up data signal; and a pull-down driving unit, having N numbers of unit pull-down drivers and N numbers of pull-down resistors, turned on by selected pull-down control signals for pull-down driving the output terminal in response to a pull-down data signal, wherein each of the N numbers of unit pull-up drivers has the same driving strength, and the N numbers of pull-up resistors are connected between the output terminal and the N numbers of unit pull-up drivers; and each of the N numbers of unit pull-down drivers has the same driving strength, and the N numbers of pull-down resistors are connected between the output terminal and the N numbers of unit pull-down drivers.

7 Claims, 12 Drawing Sheets

DATA OUTPUT DRIVER

FIELD OF INVENTION

The present invention relates to a semiconductor device; and, more particularly, to a data output driver, for use in a semiconductor memory device, having ability of controlling an output impedance.

DESCRIPTION OF PRIOR ART

A dynamic random access memory (DRAM) has been improved continuously to increase its operational speed. Synchronizing an internal clock signal with an external clock signal is one of methods to improve an operational speed of the DRAM. The DRAM operated in synchronization with the external clock signal is called a synchronous dynamic random access memory (SDRAM).

The SDRAM performs a data access operation at a rising edge of the external clock signal. That is, the SDRAM can perform the data access operation once within one cycle of the external clock signal.

Such an SDRAM that performs the data access operation once within one cycle of the external clock signal is particularly called a single data rate (SDR) SDRAM.

However, the SDR SDRAM had to be more improved for use in a high speed system. Therefore, a double data rate (DDR) SDRAM has been developed. The DDR SDRAM performs the data access operation at a rising edge and a falling edge of the external clock signal. That is, the DDR SDRAM performs the data access operation twice within one cycle of the external clock signal.

A double data rate 2 (DDR2) SDRAM is an upgraded version of the DDR SDRAM.

For enhancing an operational speed of the DDR2 SDRAM, new concepts are proposed by an international electronics standardization organization, namely the Joint Electron Device Engineering Council (JEDEC). An off chip driver (OCD) calibration control is one of the proposed new concepts.

The OCD calibration control means adjusting an impedance of data output drivers to have an optimized data output driver impedance. The optimized data output driver impedance can be found by measuring a current flown from an external device such as a chipset to the data output driver or a voltage between the chipset and the data output driver.

Therefore, for that purpose described above, the DDR2 SDRAM should have an ability of adjusting the impedance of data output drivers.

Figure 1:
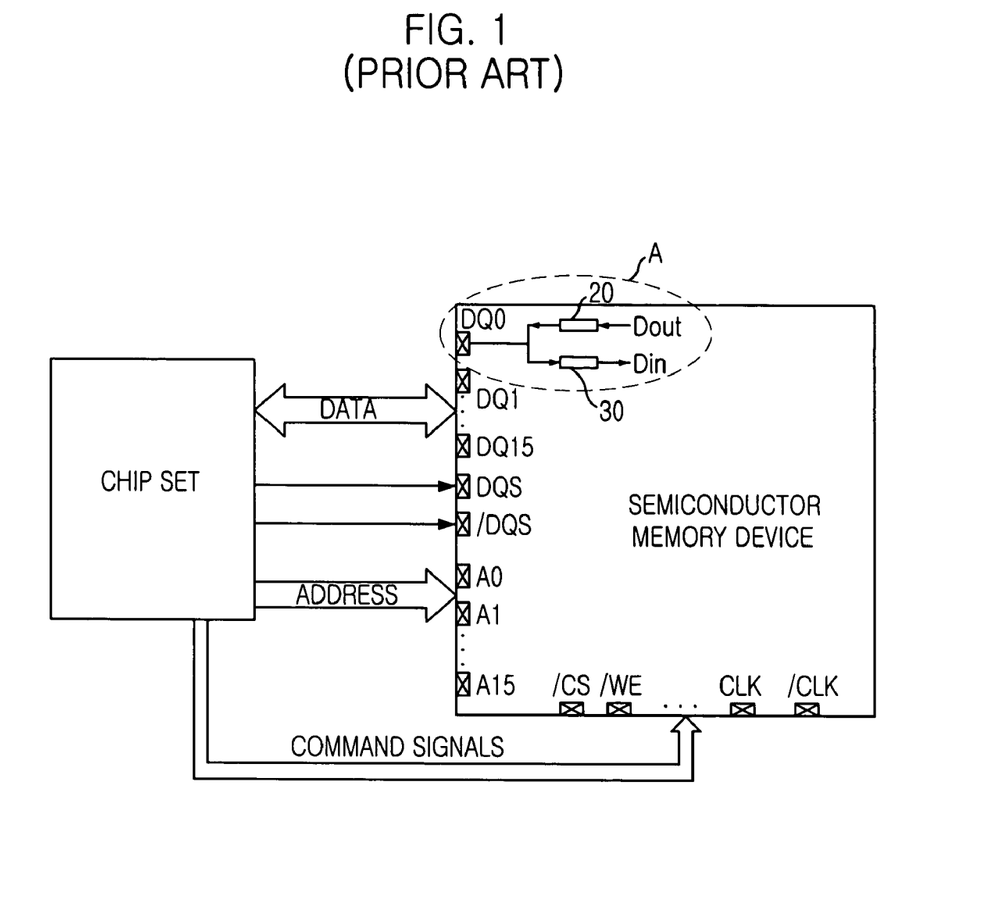
FIG. 1 is a block diagram showing a data interface between a chipset and a conventional DDR SDRAM.

FIG. 1 is a block diagram showing a data interface between a chipset and a conventional DDR SDRAM.

The data interface shown in FIG. 1 shows roughly how data access operation is performed.

As shown, the conventional DDR SDRAM receives a plurality of command signals such as a chip selection bar signal /CS, a write enable bar signal /WE, a clock signal CLK and a clock bar signal /CLK from the chipset. The conventional DDR SDRAM also receives a plurality of address signals A0 to A15. In addition, the conventional DDR SDRAM receives or outputs data through a plurality of data output pins DQ0 to DQ15.

Each of the data output pins DQ0 to DQ15 has a data output driver 20 and an input buffer 30.

The conventional DDR SDRAM receives or outputs a data strobe signal DQS and its inverted signal, namely a data strobe bar signal /DQS through a data strobe input pin. The data strobe signal DQS repeatedly changes its logic level while the data access operation is performed. The conventional DDR SDRAM aligns an inputted data using the data strobe signal DQS and transfers the aligned data to the inside of the DDR SDRAM.

Figure 2:
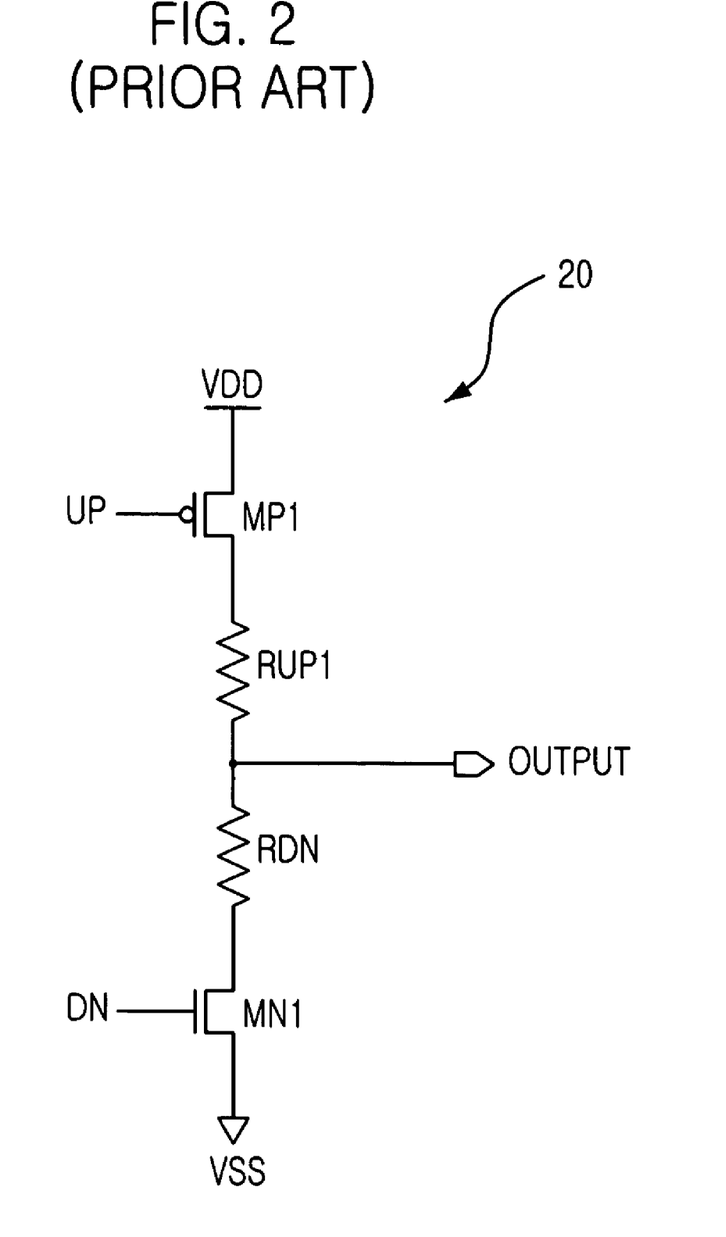
FIG. 2 is a schematic circuit diagram showing a data output driver included in the conventional DDR SDRAM.

FIG. 2 is a schematic circuit diagram showing the data output driver 20 shown in FIG. 1.

As shown, the data output driver 20 includes a pull-up MOS transistor MP1, a pull-down MOS transistor MN1, a first pull-up resistor RUP1 and a first pull-down resistor RDN1.

The pull-up MOS transistor MP1 receives a pull-up data signal UP through its gate to output a power supply voltage VDD as a data output signal OUTPUT. The pull-down MOS transistor MN1 receives a pull-down data signal DN through its gate to output a ground voltage VSS as the data output signal OUTPUT. The first pull-up resistor RUP1 and the first pull-down resistor RDN1 control amplitude of the data output signal OUTPUT.

An operation of the data output driver 20 shown in FIG. 2 is described below referring to FIGS. 1 and 2.

If the pull-up data signal UP is activated as a logic LOW level, the pull-up MOS transistor MP1 is turned on and the data output signal OUTPUT is outputted as a logic HIGH level. On the other hand, if the pull-down data signal DN is activated as a logic HIGH level, the pull-down MOS transistor MN1 is turned on and the data output signal OUTPUT is outputted as a logic LOW level.

Meanwhile, the data output driver impedance is required to have various values in order to be applied in various systems.

Figure 3:
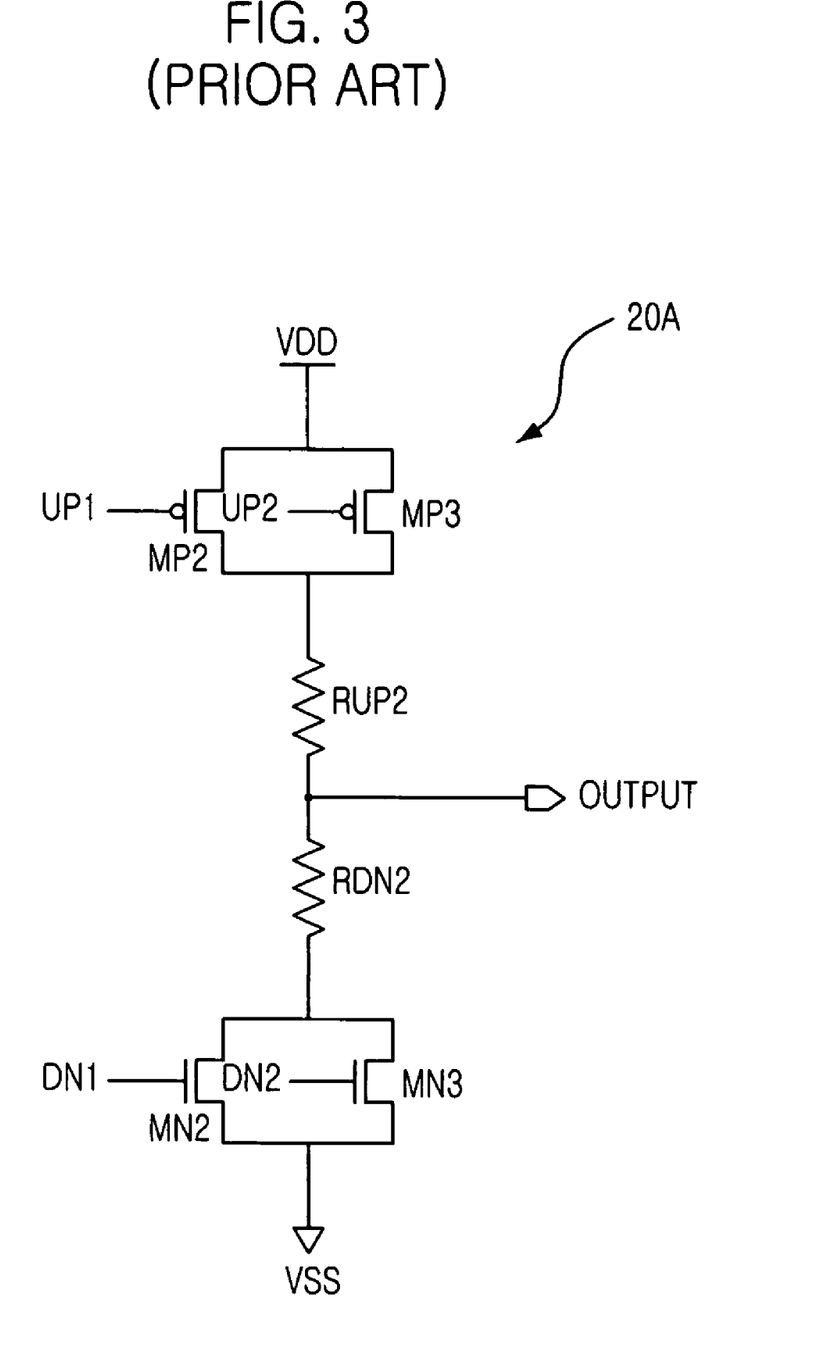
FIG. 3 is a schematic circuit diagram showing an advanced data output driver included in the conventional DDR SDRAM.

FIG. 3 is a schematic circuit diagram showing an advanced data output driver 20A. The advanced data output driver 20A shown in FIG. 3 is an upgraded version of the data output driver 20 shown in FIG. 2. The advanced data output driver 20A can be used in the conventional DDR SDRAM instead of the data output driver 20.

As shown, the advanced data output driver 20A includes a first pull-up MOS transistor MP2, a second pull-up MOS transistor MP3, a first pull-down MOS transistor MN2, a second pull-down MOS transistor MN3, a second pull-up resistor RUP2 and a second pull-down resistor RDN2.

The first and second pull-up MOS transistors MP2 and MP3 receive a first pull-up data signal UP1 and a second pull-up data signal UP2 respectively.

The advanced data driver 20A receives both the first and the second pull-up data signals UP1 and UP2 activated as a logic LOW level or only the first pull-up data signal UP1 activated as a logic LOW level in order to output data of a logic HIGH level.

Likewise, the advanced data driver 20A receives both the first and the second pull-down data signals DN1 and DN2 activated as a logic HIGH level or only the first pull-down data signal activated as a logic HIGH level in order to output data of a logic LOW level.

The advanced data driver 20A is in a full mode if it receives both the first and the second pull-up data signals UP1 and UP2 to output the data of a logic HIGH level, or if it receives both the first and the second pull-down data signals DN1 and DN2 to output the data of logic LOW level. On the other hand, the advanced data driver 20A is in a weak mode if it receives the first pull-up data signal UP1 to output the data of a logic HIGH level, or if it receives the first pull-down data signal DN1 to output the data of a logic LOW level.

The reason why the advanced data driver 20A is operated in different driving strength modes, i.e., the full mode and the weak mode, is to perform the data access operation to a high speed with low power consumption.

If a driving strength of the advanced data driver 20A is unnecessarily too strong, a power is excessively consumed and there can be a noise due to a high current flow. Therefore, the advanced data driver 20A is operated in different driving strength modes depending on systems. That is, the advanced data driver 20A is operated in the full mode when a full strength driving ability is needed or operated in the weak mode when a weak strength driving ability is needed.

However, the advanced data driver 20A is required to be operated in more various driving strength modes to be applied in various systems.

Therefore, the JEDEC proposed the OCD calibration control to be applied in the DDR2 SDRAM as described above. A data output driver, having ability of the OCD calibration control, can find an optimized data output driver impedance for a semiconductor memory device where the data output driver is applied and use the found optimized data output driver impedance as an impedance of the data output driver.

SUMMARY OF INVENTION

It is, therefore, an object of the present invention to provide a data output driver, for use in a semiconductor memory device, having ability of adjusting an output impedance of the data output driver.

In accordance with an aspect of the present invention, there is provided a data output driver which increases its output terminal driving strength linearly in proportion to the number of activated N numbers of pull-up control signals and N numbers of pull-down control signals, comprising a pull-up driving unit, having N numbers of unit pull-up drivers and N numbers of pull-up resistors, turned on by selected pull-up control signals for pull-up driving the output terminal in response to a pull-up data signal; and a pull-down driving unit, having N numbers of unit pull-down drivers and N numbers of pull-down resistors, turned on by selected pull-down control signals for pull-down driving the output terminal in response to a pull-down data signal, wherein each of the N numbers of unit pull-up drivers has the same driving strength, and the N numbers of pull-up resistors are connected between the output terminal and the N numbers of unit pull-up drivers; and each of the N numbers of unit pull-down drivers has the same driving strength, and the N numbers of pull-down resistors are connected between the output terminal and the N numbers of unit pull-down drivers.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor device in accordance with the present invention will be described in detail referring to the accompanying drawings.

Figure 4:
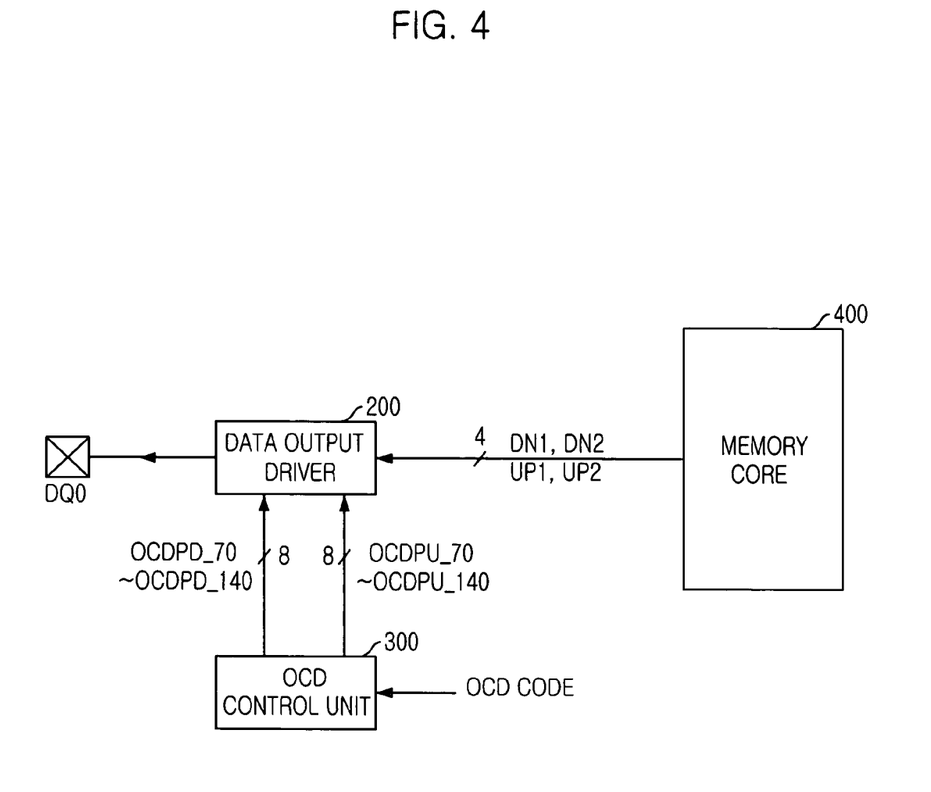
FIG. 4 is a block diagram showing a data output unit included in a DDR2 SDRAM in accordance with the present invention.

FIG. 4 is a block diagram showing a data output unit included in a DDR2 SDRAM in accordance with the present invention.

As shown, the data output unit includes a data output driver 200 and an OCD control unit 300.

The data output driver 200 receives a first pull-up data signal UP1, a second pull-up data signal UP2, a first pull-down data signal DN1 and a second pull-down data signal DN2 to output data by performing a pull-up or a pull-down operation of the output driver 200. The data output driver 200 receives a plurality of pull-up control signals OCDPU_70, OCDPU_80, . . . and OCDPU_140 and a plurality of pull-down control signals OCDPD_70, OCDPD_80, . . . and OCDPD_140 in order to adjust its output impedance.

The OCD control unit 300 receives and decodes an OCD code to output the plurality of pull-up and pull-down control signals OCDPU_70 to OCDPU_140 and OCDPD_70 to OCDPD_140.

Figure 5:
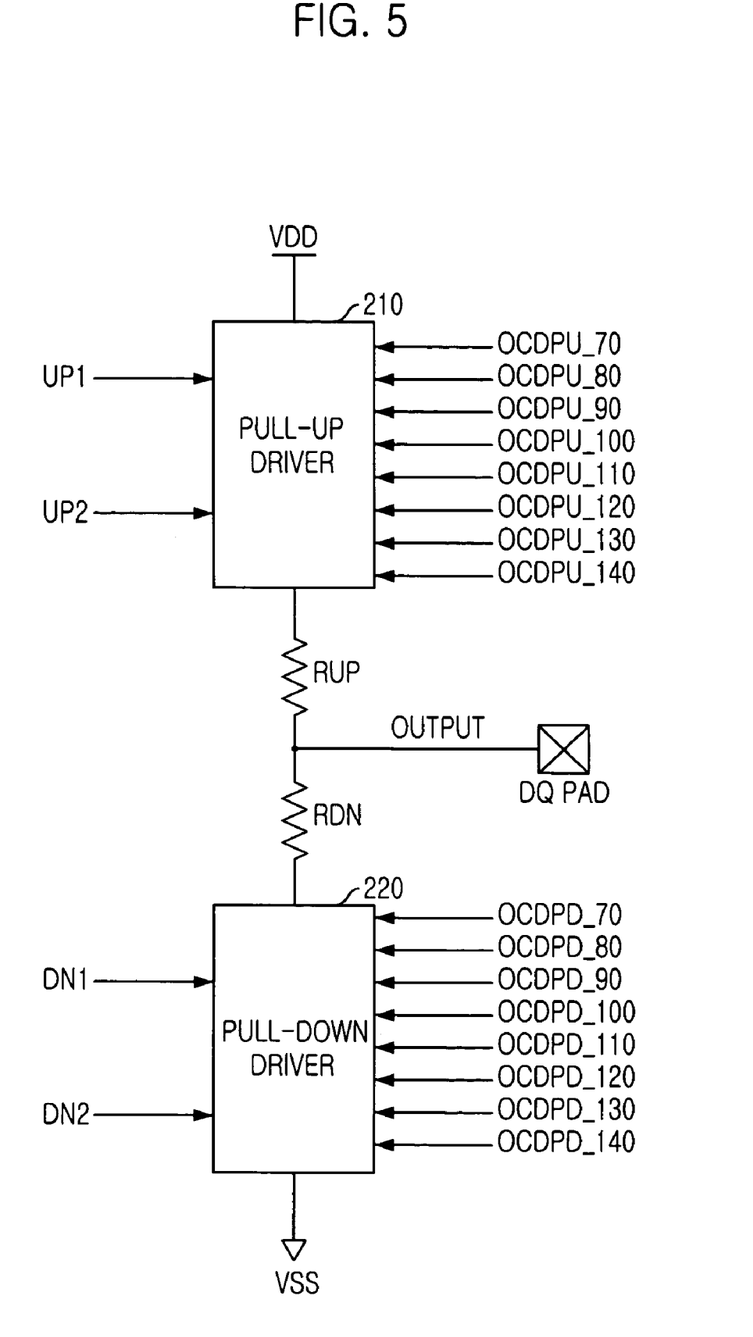
FIG. 5 is a block diagram showing a data output driver shown in FIG. 4 in accordance with the preferred embodiment of the present invention.

FIG. 5 is a block diagram showing the data output driver 200 shown in FIG. 4 in accordance with a preferred embodiment of the present invention.

As shown, the data output driver 200 includes a pull-up driver 210, a pull-down driver 220, a pull-up resistor RUP and a pull-down resistor RDN.

The pull-up driver 210 receives the first and the second pull-up data signals UP1 and UP2 to output a data output signal OUTPUT as a logic HIGH level through a data output terminal, i.e., a DQ pad. The pull-up driver 210 also receives the plurality of pull-up control signals OCDPU_70 to OCDPU_140 to adjust an output impedance of the data output signal OUTPUT.

The pull-down driver 220 receives the first and the second pull-down data signals DN1 and DN2 to output the data output signal OUTPUT as a logic LOW level through the DQ pad. The pull-down driver 220 also receives the plurality of pull-down control signals OCDPD_70 to OCDPD_140 to adjust the output impedance of the data output signal OUTPUT.

The pull-up and the pull-down resistors RUP and RDN control amplitude of the data output signal OUTPUT.

The pull-up driver 210 is operated in a full mode or in a weak mode. In the full mode, the pull-up driver 210 receives both the first and the second pull-up signals UP1 and UP2 and has 100% driving strength. In the weak mode, the pull-up driver 210 receives only the first pull-up signal UP1 and has about 60% driving strength.

Likewise, the pull-down driver 220 is operated in the full mode or in the weak mode. In the full mode, the pull-down driver 220 receives both the first and the second pull-down data signals DN1 and DN2 and has the 100% driving strength. In the weak mode, the pull-down driver 220 receives only the first pull-down data signal DN1 and has about 60% driving strength.

In addition, the pull-up driver 210 and the pull-down driver 220 receive the plurality of pull-up and pull-down control signals OCDPU_70 to OCDPU_140 and OCDPD_70 to OCDPD_140 respectively in order to adjust the output impedance, i.e., a driving strength of the data output signal OUTPUT.

Figure 6A:
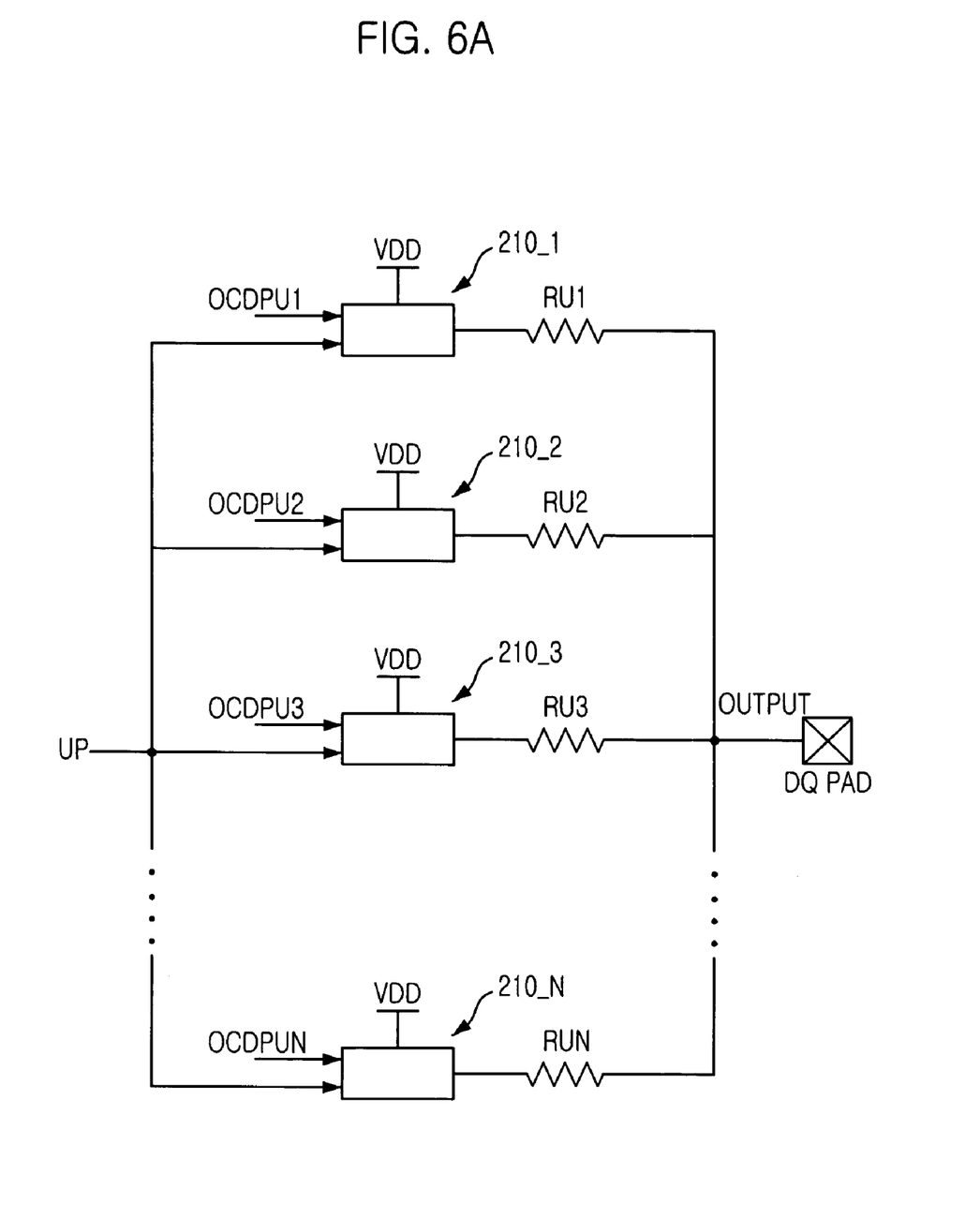
FIGS. 6A and 6B are block diagrams respectively showing a pull-up driver and a pull-down driver included in the data output driver in accordance with the preferred embodiment of the present invention.
Figure 6B:
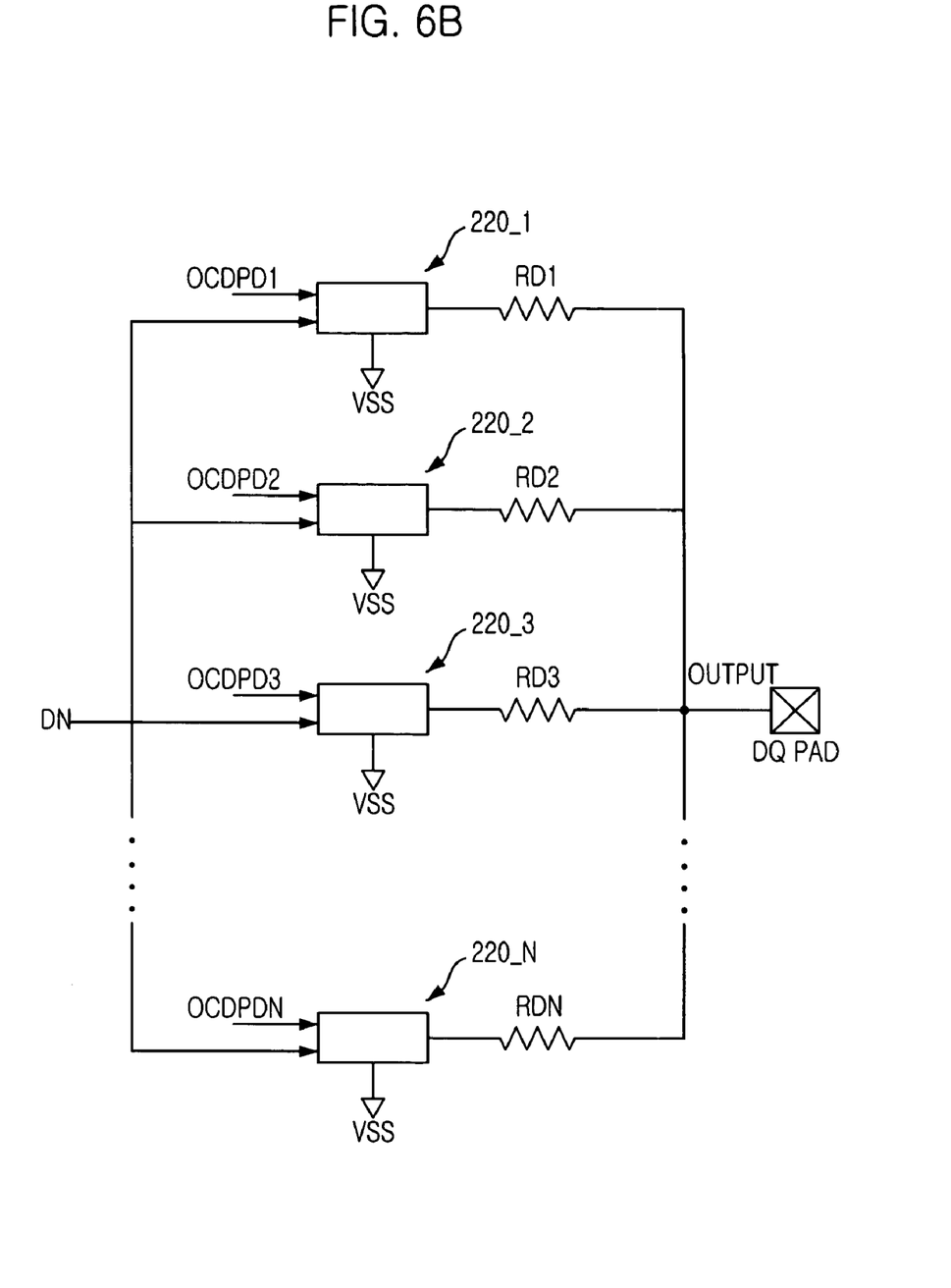

FIGS. 6A and 6B are block diagrams respectively showing the pull-up driver 210 and the pull-down driver 220 included in the data output driver 200 in accordance with the preferred embodiment of the present invention.

As shown, the pull-up driver 210 shown in FIG. 6A includes N numbers of unit pull-up drivers 210_1 to 210_N and N numbers of pull-up resistors RU1 to RUN.

The unit pull-up drivers 210_1 to 210_N receive N numbers of pull-up control-codes OCDPU1 to OCDPUN respectively and are connected to the pull-up resistors RU1 to RUN respectively. Each of the unit pull-up drivers 210_1 to 210_N receives a pull-up data signal UP and has the same driving strength.

The pull-up driver 210 performs a pull-up operation for the data output signal OUTPUT and the driving strength is determined by the number of activated signals among the pull-up control codes OCDPU1 to OCDPUN.

Likewise, the pull-down driver 220 includes N numbers of unit pull-down drivers 220_1 to 220_N and N numbers of pull-down resistors RD1 to RDN.

The unit pull-down drivers 220_1 to 220_N receive N numbers of pull-down control codes OCDPD1 to OCDPDN respectively and are connected to the pull-down resistors RU1 to RUN respectively. Each of the unit pull-down drivers 220_1 to 220_N receives a pull-down data signal DN and has the same driving strength.

The pull-down driver 220 performs a pull-down operation for the data output signal OUTPUT and the driving strength is determined by the number of activated signals among the pull-down control codes OCDPD1 to OCDPDN.

Figure 7A:
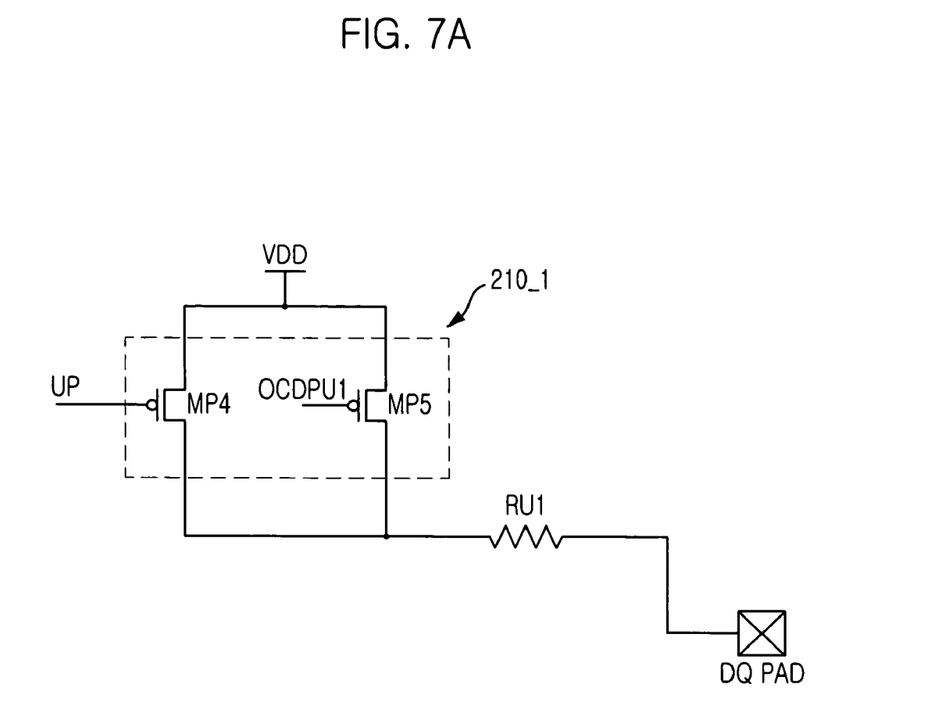
FIG. 7A is a schematic circuit diagram showing one of unit pull-up drivers shown in FIG. 6A.

FIG. 7A is a schematic circuit diagram showing one of the unit pull-up drivers shown in FIG. 6A.

As shown, a first unit pull-up driver 210_1 includes a first pull-up PMOS transistor MP4 and a second pull-up PMOS transistor MP5.

The first PMOS transistor MP4 is turned on by the pull-up data signal UP to thereby transfer a power supply voltage VDD to the DQ pad. The second PMOS transistor MP5 is turned on by the OCDPU1 to thereby transfer the power supply voltage VDD to the DQ pad.

Figure 7B:
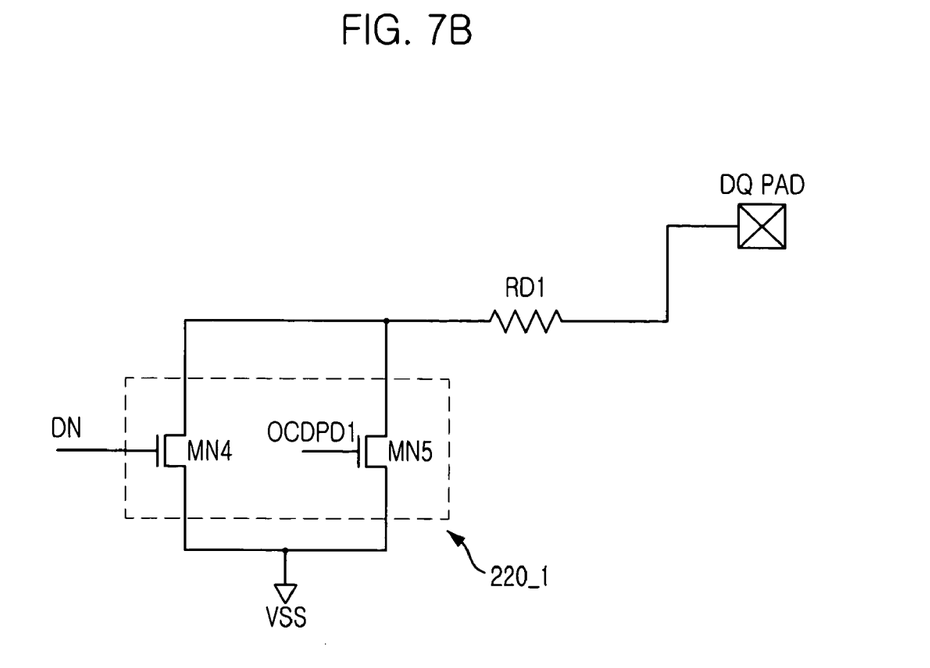
FIG. 7B is a schematic circuit diagram showing one of unit pull-down drivers shown in FIG. 6B.

FIG. 7B is a schematic circuit diagram showing one of the unit pull-down drivers shown in FIG. 6B.

As shown, a first unit pull-down driver 220_1 includes a first pull-down NMOS transistor MN4 and a second pull-down NMOS transistor MN5.

The first NMOS transistor MN4 is turned on by the pull-down data signal DN to thereby transfer a ground voltage VSS to the DQ pad. The second NMOS transistor MN5 is turned on by the OCDPD1 to thereby transfer the ground voltage VDD to the DQ pad.

Figure 8A:
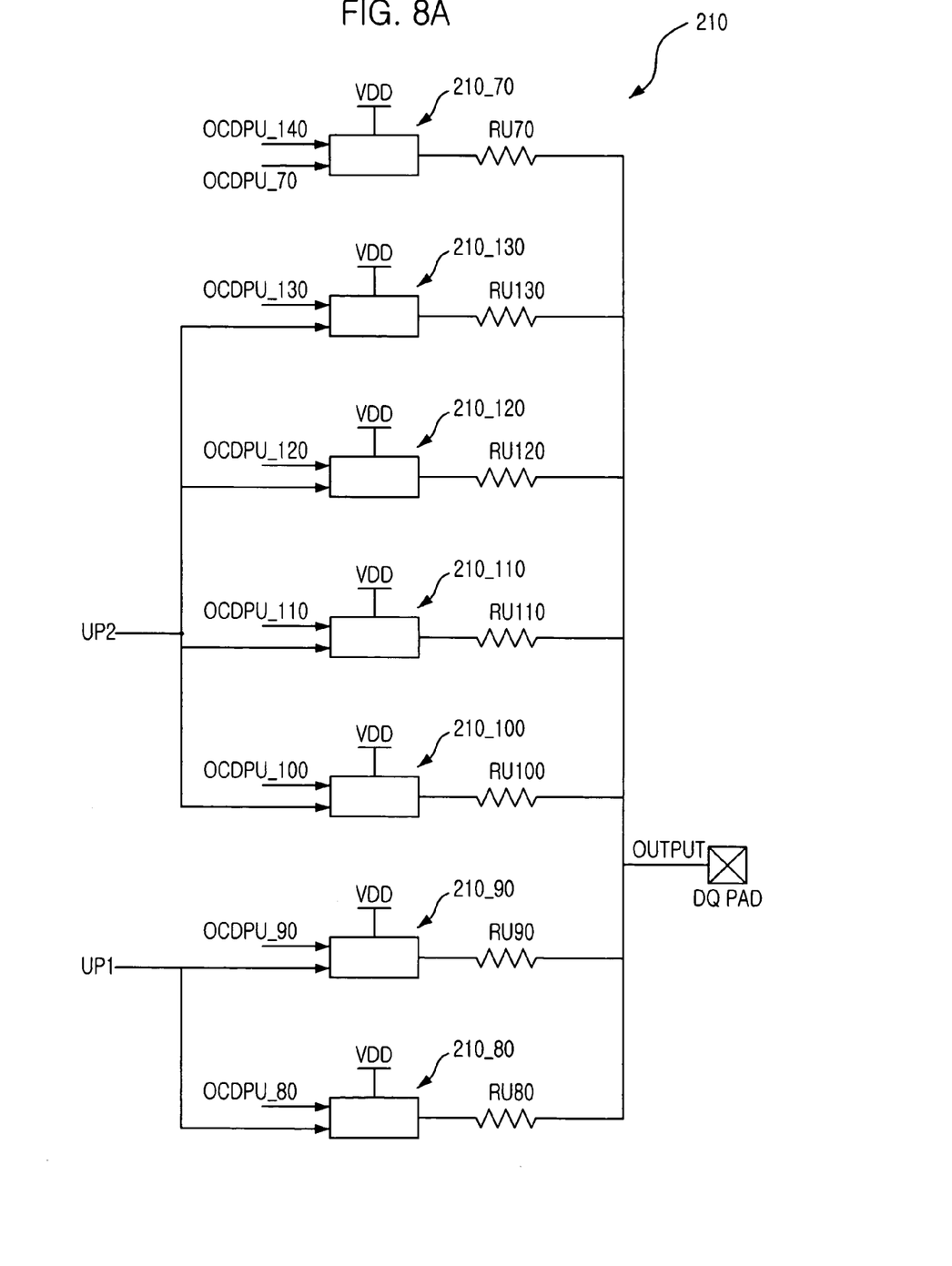
FIG. 8A is a block diagram showing a pull-up driver included in the data output driver in accordance with the another embodiment of the present invention.

FIG. 8A is a block diagram showing the pull-up driver 210 included in the data output driver 200 in accordance with an another embodiment of the present invention.

As shown, the pull-up driver 210 includes a plurality of unit pull-up drivers 210_70, 210_80, . . . and 210_130 and a plurality of pull-up resistors RU70, RU80, . . . and RU130. Herein, a total parallel resistance of the plurality of pull-up resistors RU70 to RU130 is equal to that of the pull-up resistor RUP shown in FIG. 5.

The pull-up drivers 210_80 to 210_130 receive the pull-up control signals OCDPU_80 to OCDPU_130 respectively and the pull-up driver 210_70 receives the pull-up control signals OCDPU_70 and OCDPU_140 in order to adjust the output impedance, i.e., the driving strength of the data output signal OUTPUT. The driving strength of the data output signal OUTPUT is determined by the number of activated signals among the plurality of pull-up control signals OCDPU_70 to OCDPU_140.

The pull-up drivers 210_80 and 210_90 are turned on by the pull-up control signals OCDPU_80 and OCDPU_90 respectively to thereby perform a pull-up operation for the data output signal OUTPUT in response to the first pull-up data signal UP1.

The pull-up drivers 210_100 to 210_130 receive the pull-up control signals OCDPU_100 to OCDPU_130 respectively to thereby perform a pull-up operation for the data output signal OUTPUT in response to the second pull-up data signal UP2.

The pull-up driver 210_70 receives neither the first pull-up data signal UP1 nor the second pull-up data signal UP2. The pull-up driver OCDPU_70 is always activated as a logic HIGH level and is turned on by the pull-up control signal OCDPU_140 to thereby connect the power supply voltage VDD to the DQ pad in response to the pull-up control signal OCDPU_70.

The pull-up driver 210 can be modified so that the pull-up control signal 210_70 receives the second pull-up data signal UP2 instead of the pull-up control signal OCDPU_70.

The pull-up driver 210 is operated in the full mode or in the weak mode depending on the first and the second pull-up data signals UP1 and UP2. That is, if only the first pull-up data signal UP1 is inputted, the pull-up driver 210 is operated in the weak mode having about 60% driving strength; and, if both the first and the second pull-up data signals UP1 and UP2 are inputted, the pull-up driver 210 is operated in the full mode having 100% driving strength.

Figure 8B:
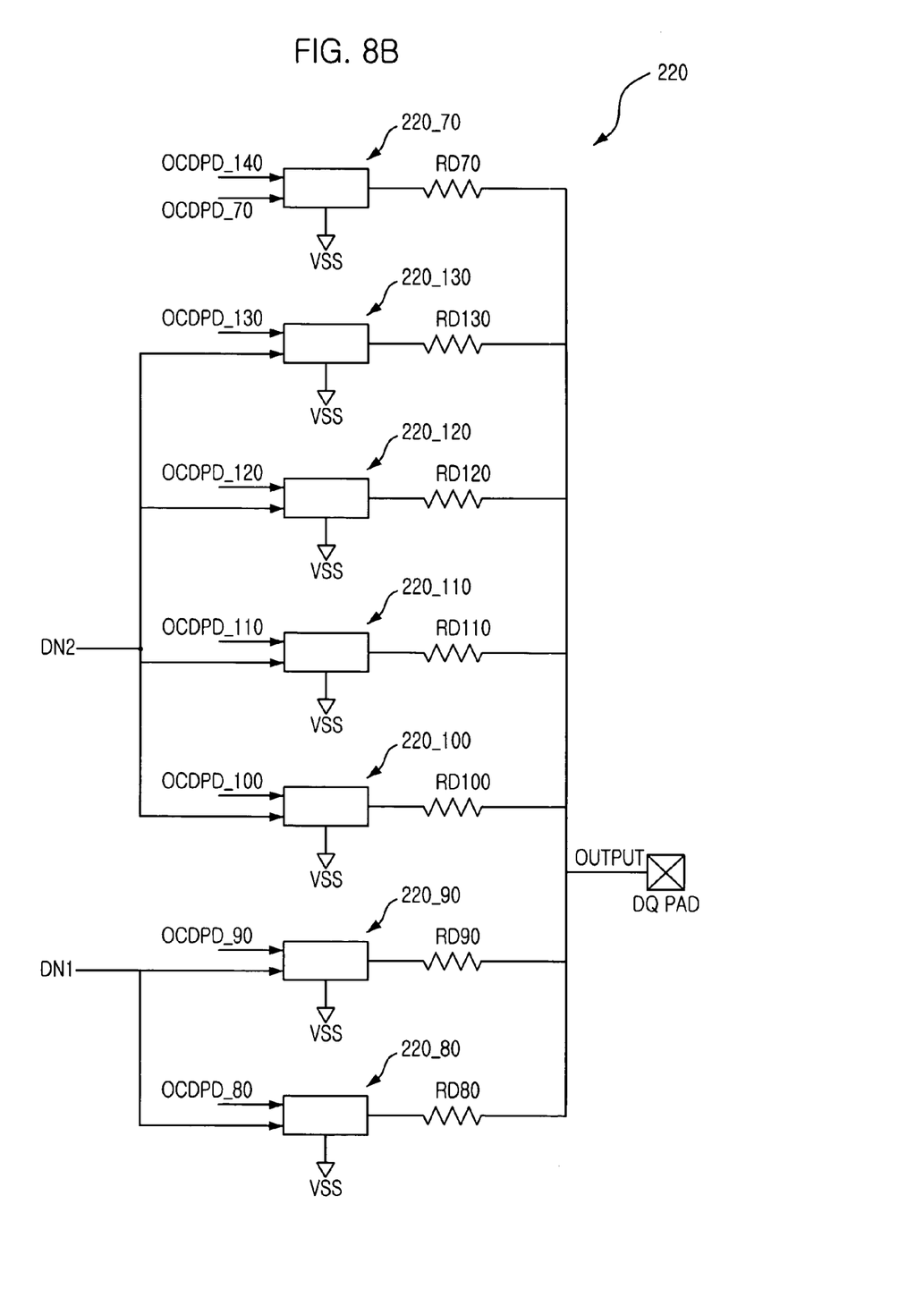
FIG. 8B is a block diagram showing a pull-down driver included in the data output driver in accordance with the another embodiment of the present invention.

FIG. 8B is a block diagram showing the pull-down driver 220 included in the data output driver 200 in accordance with the another embodiment of the present invention.

As shown, the pull-down driver 220 includes a plurality of unit pull-down drivers 220_70, 220_80, . . . and 220_130 and a plurality of pull-down resistors RD70, RD80, . . . and RD130. Herein, a total parallel resistance of the plurality of pull-down resistors RD70 to RD130 is equal to that of the pull-down resistor RDN shown in FIG. 5.

The pull-down drivers 220_80 to 220_130 receive the pull-down control signals OCDPD_80 to OCDPD_130 respectively and the pull-down driver 220_70 receives the pull-down control signals OCDPD_70 and OCDPD_140 in order to adjust the output impedance, i.e., the driving strength of the data output signal OUTPUT. The driving strength of the data output signal OUTPUT is determined by the number of activated signals among the plurality of pull-down control signals OCDPD_70 to OCDPD_140.

The pull-down drivers 220_80 and 220_90 are turned on by the pull-down control signals OCDPD_80 and OCDPD_90 respectively to thereby perform a pull-down operation for the data output signal OUTPUT in response to the first pull-down data signal DN1.

The pull-down drivers 220_100 to 220_130 receive the pull-down control signals OCDPD_100 to OCDPD_130 respectively to thereby perform a pull-down operation for the data output signal OUTPUT in response to the second pull-down data signal DN2.

The pull-down driver 220 is operated in the full mode or in the weak mode depending on the first and the second pull-down data signals DN1 and DN2. That is, if only the first pull-down data signal DN1 is inputted, the pull-down driver 220 is operated in the weak mode having about 60% driving strength; and, if both the first and the second pull-down data signals DN1 and DN2 are inputted, the pull-down driver 220 is operated in the full mode having 100% driving strength.

Figure 9A:
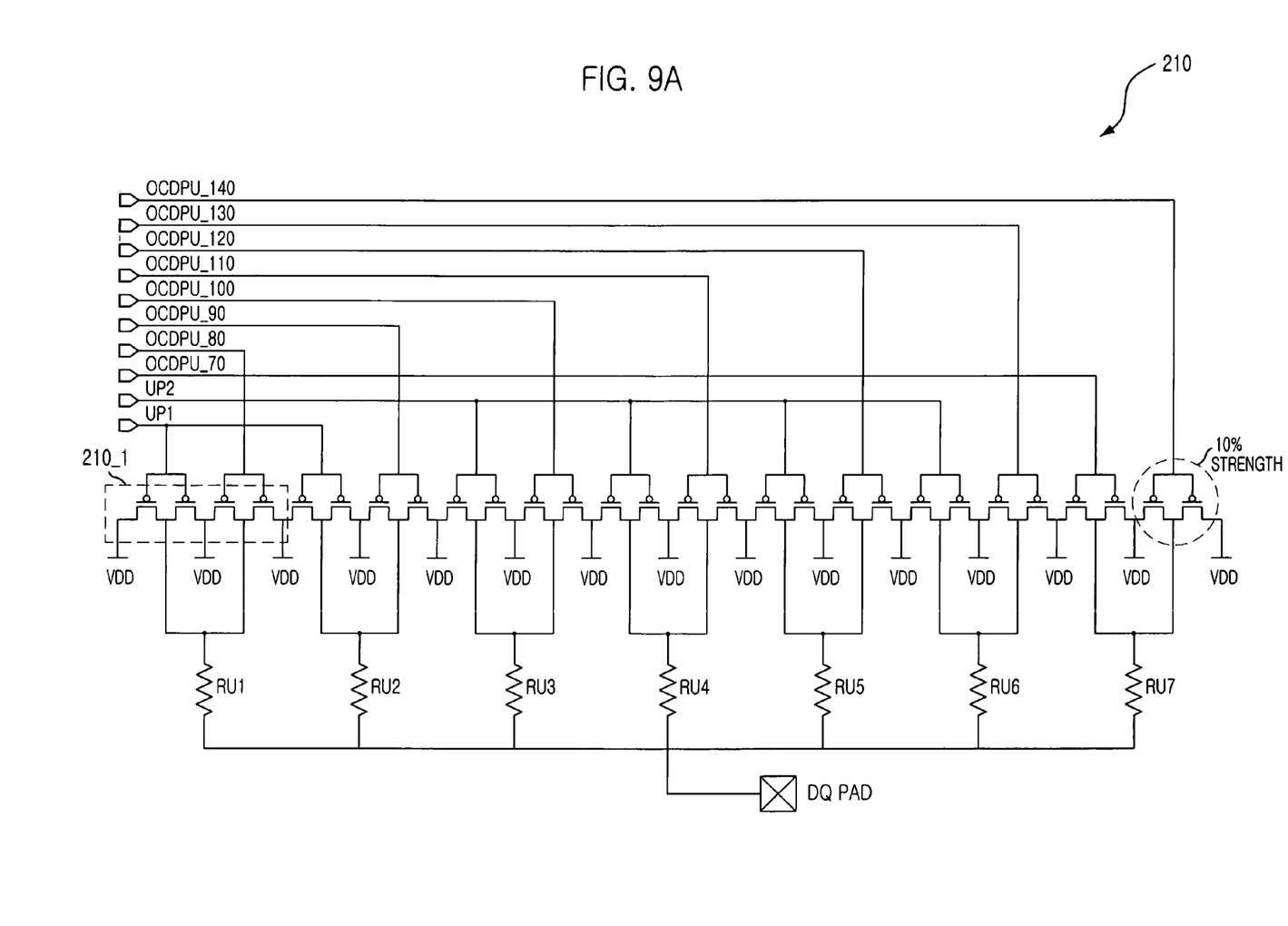
FIGS. 9A and 9B are schematic circuit diagrams respectively showing the pull-up driver and the pull-down driver included in the data output driver in accordance with the another embodiment of the present invention.
Figure 9B:
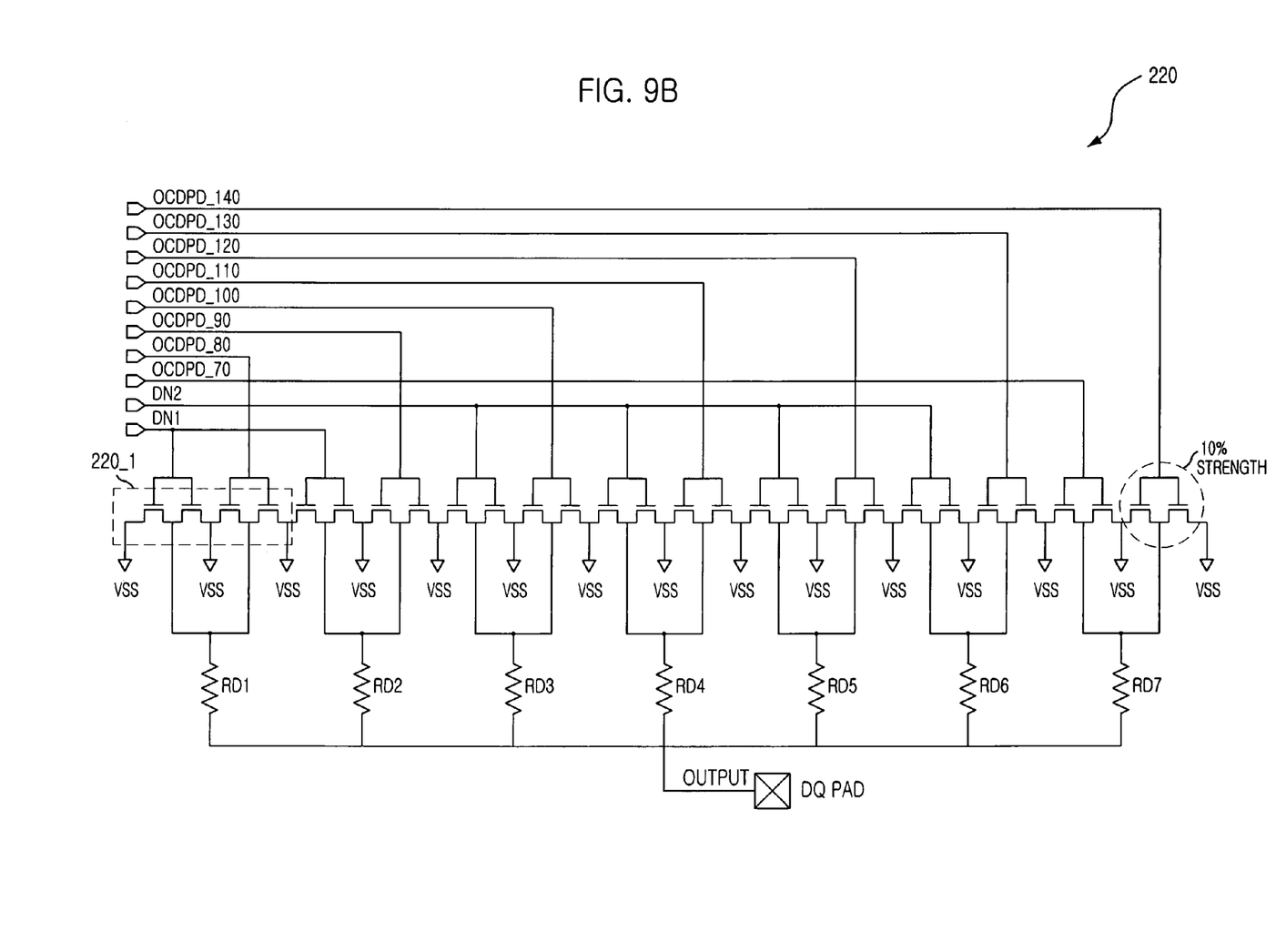

FIGS. 9A and 9B are schematic circuit diagrams showing the pull-up driver 210 and the pull-down driver 220 respectively.

Referring to FIGS. 9A and 9B, operation of the pull-up driver 210 and the pull-down driver 220 is described below.

The pull-up driver 210 shown in FIG. 9A receives the first and the second pull-up data signals UP1 and UP2 to be operated in the full mode or in the weak mode as described above.

As shown in FIG. 9A, the pull-up diver 210 is provided with the plurality of unit pull-up drivers corresponding to the plurality of pull-up control signals respectively and is also provided with the plurality of pull-up resistors RU1 to RU7 to thereby adjust the output impedance of the data output signal OUTPUT. The total parallel resistance of the plurality of pull-up resistors RU1 to RU7 is equal to that of the pull-up resistor RUP shown in FIG. 5.

Assuming that a conventional data output driver has 100% driving strength, the data output driver 200 included in the DDR2 SDRAM in accordance with the present invention has an ability of raising the driving strength up to 140%. The 140% driving strength is commonly adopted by chipset manufacturers and semiconductor memory device manufacturers.

For that purpose described above, the pull-up driver 210 is provided with twenty eight PMOS transistors. Each of the PMOS transistors is connected between the power supply voltage VDD and the DQ pad. The twenty eight PMOS transistors are paired in fourteen. Therefore, the pull-up driver 210 includes fourteen PMOS transistor pairs and each of the fourteen PMOS transistor pairs includes two PMOS transistors having 10% driving strength.

Each of the plurality of unit pull-up drivers 210_70 to 210_130 consists of two pairs of the fourteen PMOS transistor pairs in order to receive one of the first and the second pull-up data signals UP1 and UP2 and one of the plurality of pull-up control signals OCDPU_70 to OCDPU_140. For example, as shown in FIG. 9A, the 210_80 consists of two pairs of the fourteen PMOS transistor pairs. One pair serves to receive the first pull-up data signal UP1 and the other pair serves to receive the OCDPU_80.

However, the 210_70 does not receive neither the first pull-up data signal UP1 nor the second pull-up data signal UP2. The 210_70 receives two of the plurality of pull-up control signals OCDPU_70 to OCDPU_140, i.e., the OCDPU_70 and OCDPU_140 since the OCDPU_70 is always activated as a logic LOW level as described above.

The unit pull-up drivers 210_70 to 210_130 are connected to the pull-up resistors RU70 to RU130 respectively. Each of the pull-up resistors RU70 to RU130 is connected to the DQ pad.

The total parallel resistance of the pull-up resistors RU70 to RU130 is equal to a resistance shown from the DQ pad because a predetermined current is always flown through the pull-up resistors RU70 to RU130.

Operation of the pull-down driver 220 is the same as that of the pull-up driver 210 described above.

Therefore, the data output driver 200 in accordance with the present invention can perform the OCD calibration control proposed by the JEDEC having the full mode and the weak mode.

The present application contains subject matter related to Korean patent application No. 2003-58722, filed in the Korean Patent Office on Aug. 25, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A data output driver which increases its output terminal driving strength linearly in proportion to a number of activated N numbers of pull-up control signals and N numbers of pull-down control signals, comprising:
   a pull-up driving unit, having N numbers of unit pull-up drivers and N numbers of pull-up resistors, turned on by selected pull-up control signals for pull-up driving the output terminal in response to a pull-up data signal wherein the unit pull-up driver includes a first pull-up PMOS transistor turned on by a pull-up control signal to transfer a power supply voltage to the output terminal and a second pull-up PMOS transistor turned on by the pull-up data signal to transfer the power supply voltage to the output terminal; and
   a pull-down driving unit, having N numbers of unit pull-down drivers and N numbers of pull-down resistors, turned on by selected pull-down control signals for pull-down driving the output terminal in response to a pull-down data signal wherein the unit pull-down driver includes a first pull-down NMOS transistor turned on by a pull-down control signal to transfer a ground voltage to the output terminal and a second pull-down NMOS transistor turned on by the pull-down data signal to transfer the ground voltage to the output terminal,
   wherein, each of the N numbers of unit pull-up drivers has the same driving strength, and the N numbers of pull-up resistors are connected between the output terminal and the N numbers of unit pull-up drivers; and each of the N numbers of unit pull-down drivers has the same driving strength, and the N numbers of pull-down resistors are connected between the output terminal and the N numbers of unit pull-down drivers.

2. A data pull-up driver which increases its output terminal driving strength linearly in proportion to a number of activated N numbers of pull-up control signals, comprising:
   N-L numbers of first unit pull-up drivers turned on by N-L numbers of pull-up control signals respectively for pull-up driving an output terminal in response to a first pull-up data signal wherein each of the first unit pull-up drivers includes a first pull-up PMOS transistor turned on by one of the pull-up control signals to transfer a power supply voltage to the output terminal and a second pull-up PMOS transistor turned on by the first pull-up data signal or a second pull-up data signal to transfer the power supply voltage to the output terminal;

L numbers of second unit pull-up drivers turned on by L numbers of pull-up control signals respectively for pull-up driving the output terminal in response to a second pull-up data signal; and N numbers of pull-up resistors connected between the output terminal and the N numbers of first and second unit pull-up drivers, wherein, the L numbers of pull-up control signals do not include any of the N-L numbers of pull-up control signals.

3. The data pull-up driver as recited in claim 2, wherein each of the second unit pull-up drivers includes:

a third pull-up PMOS transistor turned on by one of the pull-up control signals to transfer the power supply voltage to the output terminal; and a fourth pull-up PMOS transistor turned on by the first pull-up data signal or the second pull-up data signal to transfer the power supply voltage to the output terminal.

4. A data pull-down driver which increases its output terminal driving strength linearly in proportion to the number of activated N numbers of pull-down control signals, comprising:

N-L numbers of first unit pull-down drivers turned on by N-L numbers of pull-down control signals respectively for pull-down driving the output terminal in response to a first pull-down data signal wherein each of the first unit pull-down drivers includes a first pull-down NMOS transistor turned on by one of the pull-down control signals to transfer a power supply voltage to the output terminal and a second pull-down NMOS transistor turned on by the first pull-down data signal or a second pull-down data signal to transfer the power supply voltage to the output terminal;

L numbers of second unit pull-down drivers turned on by L numbers of pull-down control signals respectively for pull-down driving the output terminal in response to a second pull-down data signal; and N numbers of pull-down resistors connected between the output terminal and the N numbers of first and second unit pull-down drivers, wherein, the L numbers of pull-down control signals do not include any of the N-L numbers of pull-down control signals.

5. The data pull-down driver as recited in claim 4, wherein each of the second unit pull-down drivers includes:

a third pull-down NMOS transistor turned on by one of the pull-down control signals to transfer the power supply voltage to the output terminal; and a fourth pull-down NMOS transistor turned on by the first pull-down data signal or the second pull-down data signal to transfer the power supply voltage to the output terminal.

6. A data pull-up driver, for use in a semiconductor memory device, increases its output terminal driving strength linearly in proportion to the number of activated signals among first to seventh pull-up control signals, comprising:

a first unit pull-up driver including a first pull-up PMOS transistor turned on by a first pull-up data signal to transfer a power supply voltage to the output terminal, a second pull-up PMOS transistor turned on by the first pull-up control signal to transfer the power supply voltage to the output terminal and a first resistor connected between the output terminal and the first and second pull-up PMOS transistors;

a second unit pull-up driver including a third pull-up PMOS transistor turned on by the first pull-up data signal to transfer the power supply voltage to the output terminal, a fourth pull-up PMOS transistor turned on by the second pull-up control signal to transfer the power supply voltage to the output terminal and a second resistor connected between the output terminal and the third and fourth pull-up PMOS transistors;

a third unit pull-up driver including a fifth pull-up PMOS transistor turned on by a second pull-up data signal to transfer the power supply voltage to the output terminal, a sixth pull-up PMOS transistor turned on by the third pull-up control signal to transfer the power supply voltage to the output terminal and a third resistor connected between the output terminal and the fifth and sixth pull-up PMOS transistors;

a fourth unit pull-up driver including a seventh pull-up PMOS transistor turned on by the second pull-up data signal to transfer the power supply voltage to the output terminal, a eighth pull-up PMOS transistor turned on by the fourth pull-up control signal to transfer the power supply voltage to the output terminal and a fourth resistor connected between the output terminal and the seventh and eighth pull-up PMOS transistors;

a fifth unit pull-up driver including a ninth pull-up PMOS transistor turned on by the second pull-up data signal to transfer the power supply voltage to the output terminal, a tenth pull-up PMOS transistor turned on by the fifth pull-up control signal to transfer the power supply voltage to the output terminal and a fifth resistor connected between the output terminal and the ninth and tenth pull-up PMOS transistors;

a sixth unit pull-up driver including an eleventh pull-up PMOS transistor turned on by the second pull-up data signal to transfer the power supply voltage to the output terminal, a twelfth pull-up PMOS transistor turned on by the sixth pull-up control signal to transfer the power supply voltage to the output terminal and a sixth resistor connected between the output terminal and the eleventh and twelfth pull-up PMOS transistors; and a seventh unit pull-up driver including a thirteenth pull-up PMOS transistor turned on by the second pull-up data signal to transfer the power supply voltage to the output terminal, a fourteenth pull-up PMOS transistor turned on by the seventh pull-up control signal to transfer the power supply voltage to the output terminal and a seventh resistor connected between the output terminal and the thirteenth and fourteenth pull-up PMOS transistors.

7. A data pull-down driver, for use in a semiconductor memory device, increases its output terminal driving strength linearly in proportion to the number of activated signals among first to seventh pull-down control signals, comprising:

a first unit pull-down driver including a first pull-down NMOS transistor turned on by a first pull-down data signal to transfer a power supply voltage to the output terminal, a second pull-down NMOS transistor turned on by the first pull-down control signal to transfer the power supply voltage to the output terminal and a first resistor connected between the output terminal and the first and second pull-down PMOS transistors;

a second unit pull-down driver including a third pull-down NMOS transistor turned on by the first pull-down data signal to transfer the power supply voltage to the output terminal, a fourth pull-down NMOS transistor turned on by the second pull-down control signal to transfer the power supply voltage to the output terminal and a second resistor connected between the output terminal and the third and fourth pull-down NMOS transistors;

a third unit pull-down driver including a fifth pull-down NMOS transistor turned on by a second pull-down data signal to transfer the power supply voltage to the output terminal, a sixth pull-down NMOS transistor turned on by the third pull-down control signal to transfer the power supply voltage to the output terminal and a third resistor connected between the output terminal and the fifth and sixth pull-down NMOS transistors;

a fourth unit pull-down driver including a seventh pull-down NMOS transistor turned on by the second pull-down data signal to transfer the power supply voltage to the output terminal, a eighth pull-down NMOS transistor turned on by the fourth pull-down control signal to transfer the power supply voltage to the output terminal and a fourth resistor connected between the output terminal and the seventh and eighth pull-down NMOS transistors;

a fifth unit pull-down driver including a ninth pull-down NMOS transistor turned on by the second pull-down data signal to transfer the power supply voltage to the output terminal, a tenth pull-up NMOS transistor turned on by the fifth pull-down control signal to transfer the power supply voltage to the output terminal and a fifth resistor connected between the output terminal and the ninth and tenth pull-down NMOS transistors;

a sixth unit pull-down driver including an eleventh pull-down NMOS transistor turned on by the second pull-down data signal to transfer the power supply voltage to the output terminal, a twelfth pull-down NMOS transistor turned on by the sixth pull-down control signal to transfer the power supply voltage to the output terminal and a sixth resistor connected between the output terminal and the eleventh and twelfth pull-down NMOS transistors; and a seventh unit pull-down driver including a thirteenth pull-down NMOS transistor turned on by the second pull-down data signal to transfer the power supply voltage to the output terminal, a fourteenth pull-down NMOS transistor turned on by the seventh pull-down control signal to transfer the power supply voltage to the output terminal and a seventh resistor connected between the output terminal and the thirteenth and fourteenth pull-down NMOS transistors.

* * * * *